United States Patent
Kondo

(10) Patent No.: US 10,939,601 B2
(45) Date of Patent: Mar. 2, 2021

(54) COMPONENT MOUNTING LINE

(71) Applicant: FUJI CORPORATION, Chiryu (JP)

(72) Inventor: Masahiro Kondo, Kasugai (JP)

(73) Assignee: FUJI CORPORATION, Chiryu (JP)

( * ) Notice: Subject to any disclaimer, the term of this patent is extended or adjusted under 35 U.S.C. 154(b) by 223 days.

(21) Appl. No.: 16/076,349

(22) PCT Filed: Feb. 17, 2016

(86) PCT No.: PCT/JP2016/054512
§ 371 (c)(1),
(2) Date: Aug. 8, 2018

(87) PCT Pub. No.: WO2017/141366
PCT Pub. Date: Aug. 24, 2017

(65) Prior Publication Data
US 2019/0053408 A1    Feb. 14, 2019

(51) Int. Cl.
*H05K 13/08* (2006.01)
*H05K 13/04* (2006.01)
*H05K 13/02* (2006.01)

(52) U.S. Cl.
CPC ......... *H05K 13/084* (2018.08); *H05K 13/021* (2013.01); *H05K 13/0417* (2013.01); *H05K 13/0495* (2013.01); *H05K 13/086* (2018.08)

(58) Field of Classification Search
CPC .. H05K 13/084; H05K 13/086; H05K 13/021; H05K 13/0417; H05K 13/0495
See application file for complete search history.

(56) References Cited

U.S. PATENT DOCUMENTS 4,907,479 A * 3/1990 Nasu .................. B26D 5/08
83/422

FOREIGN PATENT DOCUMENTS

| CN | 104429174 A | 3/2015 | |
|---|---|---|---|
| EP | 2 874 481 A1 | 5/2015 | |
| EP | 2874480 A1 * | 5/2015 | .......... H05K 13/086 |
| JP | 61-203008 A | 9/1986 | |
| JP | 61203008 A * | 9/1986 | |
| JP | 2000-229707 A | 8/2000 | |
| JP | 2000229707 A * | 8/2000 | |
| JP | 2006-235966 A | 9/2006 | |
| JP | WO 2014/010083 A1 | 1/2014 | |

OTHER PUBLICATIONS

International Search Report dated May 10, 2016, in PCT/JP2016/054512 filed Feb. 17, 2016.

* cited by examiner

Primary Examiner — Livius R. Cazan
(74) Attorney, Agent, or Firm — Oblon, McClelland, Maier & Neustadt, L.L.P.

(57) ABSTRACT

A component mounting line configured to move an automatic exchanging device that performs setting and removing of feeders of multiple component mounters, including a position detecting device that detects the position of the automatic exchanging device is configured from a timing belt with an end and provided to extend in a straight line along the moving lane on the front side of the component mounting line, a timing pulley that moves together with the automatic exchanging device while maintaining a state in which the teeth of the timing pulley are engaged with the teeth of the timing belt, and a rotary encoder that outputs a rotation angle of the timing pulley, and the pulse output of the rotary encoder is counted to detect the position of the automatic exchanging device.

9 Claims, 6 Drawing Sheets

COMPONENT MOUNTING LINE

TECHNICAL FIELD

The present application relates to a component mounting line provided with an automatic exchanging device that automatically performs setting and removing of feeders to and from a feeder setting section of multiple component mounters arranged in a line along a conveyance direction of a circuit board.

BACKGROUND ART

With this type of production line, as disclosed in patent literature 1 (WO2014/010083), an automatic exchanging device (loader) is provided to be movable along a moving lane provided along a row of multiple component mounters that configure a component mounting line, the automatic exchanging device being moved in front of a specified component mounter based on a production job (production program) or the like, so as to perform setting and removing of a feeder to and from a feeder setting section of the component mounter. Here, with the driving device that moves the automatic exchanging device, a rack is fixed to the front side of the component mounter to extend along the moving lane, a pinion that engages with the above rack and a motor that drive-rotates the pinion are provided on the automatic exchanging device, and by rotating the pinion with the motor, the automatic exchanging device is moved along the moving lane, with control of the automatic exchanging device being performed by detecting a rotation angle of the motor (a rotation angle of the pinion) using an encoder or the like, and measuring the movement distance of the automatic exchanging device based on the detection value so as to detect the position of the automatic exchanging device.

CITATION LIST

Patent Literature

Patent literature 1: WO2014010083

BRIEF SUMMARY

Technical Problem

With patent literature 1, the automatic exchanging device is configured such that the teeth of a rack and pinion are engaged, but factors such as wear to the teeth and manufacturing and assembly variance of those items mean that the engaging state of the teeth of the rack and pinion may deteriorate, causing the teeth to interfere with each other, leading to problems such as unsmooth rotation, large noises, and damage to the teeth.

To solve these problems, the inventors considered using a configuration in which, instead of a rack and pinion, a driving wheel drive-rotated by a motor is used to move the automatic exchanging device, but because the drive wheel slips in the traveling lane, even if the rotation angle of the motor or the rotation angle of the drive wheel is detected accurately. An error arises between the detected value and the movement distance of the automatic exchanging device based on the slippage amount of the drive wheel, meaning that the position of the automatic exchanging device cannot be detected accurately.

As a countermeasure to this, one may consider providing a linear scale or a distance sensor for measuring the movement distance (position) of the automatic exchanging device, but the following problems occur.

Currently, the durability of currently available wire-type distance sensors is poor, and stable accurate measurement cannot be guaranteed. Also, laser-type distance sensors are expensive and measurement operation is easily influenced by atmospheric conditions, leading to instability, and there are risks related to blockage of the laser light and damage to the eyes of operators. Also, the sensor head of a linear scale is large and expensive, and it would be necessary to expand or reduce the scale or add and remove sections every time the quantity of component mounters was increased or decreased (line length altered), which would be troublesome work as well as causing a decrease in the measurement accuracy at the joins of the scale.

The present disclosure solves the above problems by enabling the position of an automatic exchanging device to be calculated stably with good accuracy using a cheap configuration and allowing an increase or decrease in the quantity of component mounters to be handled easily.

Solution to Problem

To solve the above problems, the present disclosure is a component mounting line including: multiple component mounters arranged in a row along a conveyance direction of a circuit board, the component mounters being configured to mount components supplied from feeders set on a feeder setting section of each of the component mounters on the circuit board; an automatic exchanging device configured to move along a moving lane provided along the row of the multiple component mounters, and to set and remove the feeders to and from the feeder setting section of each of the component mounters; a driving device configured to drive the automatic exchanging device along the moving lane using a driving wheel; a position detecting device configured to detect the position of the automatic exchanging device; and a control device configured to move the automatic exchanging device to a specified position using the driving device based on a detection result of the position detecting device, wherein the position detecting device includes a timing belt with an end provided to extend in a straight line along the moving lane straddling the multiple component mounters, a timing pulley configured to move together with the automatic exchanging device while maintaining a state of being engaged with teeth of the timing belt, a rotation angle sensor configured to detect a rotation angle of the timing pulley, and a detecting circuit section configured to detect a position of the automatic exchanging device based on an output signal of the rotation angle sensor.

With this configuration, by using a configuration that moves the automatic exchanging device with a driving wheel, while achieving smooth movement, low noise levels, improved durability, and the like, by detecting a rotation angle of the timing pulley that engages with the timing belt provided straddling multiple component mounters using a rotation angle sensor, it is possible to cancel an error between the angle of the driving wheel and the movement distance of the automatic exchanging device that arises due to slipping of the driving wheel, so the position of the automatic exchanging device can be detected with good accuracy. Further, because cheap mass-produced commercially available items can be used for the timing belt, timing pulley, and rotation angle sensor that configure the position detecting device, the position detecting device can be cheap and compact, durability can be guaranteed, and when setting up the component mounters, it is sufficient to attach a single timing belt so as to straddle multiple component mounters, thus reducing the workload on an operator. Additionally, so long as the length of the timing belt is at least as long as the length of the multiple set component mounters, it is not necessary to cut the excess portion of the timing belt to match the quantity of the component mounters, because the excess portion of the timing belt can be attached in a position out of the way, tied up, or the like, meaning that it is easy to perform work such as increasing or decreasing the quantity of set component mounters (changing the line length).

In this case, the rotation angle sensor may be one of, for example, a resolver, or a magnetic type or optical type rotary encoder.

For example, the rotation angle sensor may be a rotary encoder configured to detect a forward and reverse rotation and output a pulse for each of a specified angle rotation of the timing pulley, the detecting circuit section may count the pulses output by the rotary encoder (hereinafter referred to as "encoder pulses"), and by switching the up or down count operation in accordance with the rotation direction of the timing pulley, maintain a corresponding relationship between a count value of the encoder pulses and a position of the automatic exchanging device and detect the position of the automatic exchanging device based on the count value of the encoder pulses. Here, a count operation of the encoder pulses may be performed by an up-down counter configured from an electrical circuit (hardware) or an up-down counter configured from software.

Note that, in a case of detecting the position of the automatic exchanging device using the position detecting device, it is necessary to set at least one reference position, thus, the movement distance of the automatic exchanging device from the reference position is measured from the rotation amount (rotation angle) of the timing pulley detected by the rotation angle sensor, and the movement of the automatic exchanging device is controlled by detecting the position of the automatic exchanging device with respect to the reference position based on the measured value. In this case, if each of the multiple component mounters that configure the component mounting line are set up accurately without any positional deviation, with just one reference position, no deviation arises in the corresponding relationship between the movement distance (position) of the automatic exchanging device from the reference position and the position of each of the multiple component mounters, but in reality, because there is a possibility that each of the multiple component mounters is set up with a slight positional deviation, there is a possibility that a deviation arises in the corresponding relationship between the movement distance (position) of the automatic exchanging device from the reference position and the position of each of the multiple component mounters. If there is a deviation in this corresponding relationship, the position of the automatic exchanging device with respect to each of the multiple component mounters cannot be controlled accurately, meaning that problems may occur with setting or removing feeders to and from each component mounter.

To counter this, a reference position may be provided on at least two of the component mounters out of the multiple component mounters, a reference position detecting means configured to output a reference position detection signal when the position of the automatic exchanging device matches the reference position of the component mounter may also be provided, and the position detecting device may be configured to correct a detected position of the detecting circuit section when the reference position detection signal is output from the reference position detecting means so as to correspond to the reference position of the component mounter. Accordingly, because it is possible to detect the movement distance (position) of the automatic exchanging device with respect to the reference position of at least two component mounters of the multiple component mounters, the deviation in the corresponding relationship between the movement distance (position) of the automatic exchanging device from the reference position and the position of each of the multiple component mounters can be reduced or eliminated, meaning that it is possible to control the position of the automatic exchanging device with respect to each of the multiple component mounters accurately, preventing problems when setting or removing feeders to and from the component mounters.

In this case, the position detecting device, during setup of the component mounter or during calibration prior to starting production, may use the driving device to move the automatic exchanging device, memorize in the memorizing means a corresponding relationship between the reference position of the component mounter and the detection position of the detecting circuit section when the position of the automatic exchanging device matches the reference position of the component mounter, and perform interpolation correction of the detection position of the detecting circuit section between the reference positions of the component mounters based on the data memorized in the memorizing means during production. Accordingly, the detection accuracy of the position of the automatic exchanging device between the reference positions of the component mounters is improved.

Note that, in reference position detection processing (initial processing) when starting production, it is necessary to correct the detection position of the detecting circuit section after moving the automatic exchanging device to the reference position of the component mounter to correspond to the reference position of the component mounter, but if the stopping position of the automatic exchanging device before starting production is far away from the reference position of the component mounter, it takes time to perform reference position detection processing when starting production, and the start of production is delayed by that amount.

Here, when setting the reference positions of two or more component mounters, the position detecting device, by performing reference position detection processing when starting production, may use the driving device to move the automatic exchanging device to the reference position of the nearest component mounter and correct the detection position of the detecting circuit section to correspond to the reference position of that component mounter. Accordingly, by performing reference position detection processing when starting production, it is possible to shorten the distance moved by the automatic exchanging device to the reference position of the component mounter, thus shortening the time for reference position detection processing when starting production.

Here, the reference position detecting means configured to output a reference position detection signal when the position of the automatic exchanging device matches the reference position of the component mounter may be provided on the automatic exchanging device or on the component mounter.

If the reference position detecting means is provided on the automatic exchanging device, a reference section configured to be detected by the reference position detecting means of the automatic exchanging device when the position of the automatic exchanging device matches the reference position of the component mounter may be provided on at least two of the component mounters out of the multiple component mounters.

On the other hand, if the reference position detecting means is provided on at least two of the component mounters out of the multiple component mounters, the reference section configured to be detected by the reference position detecting means of the component mounter when the position of the automatic exchanging device matches the reference position of the component mounter may be provided on the automatic exchanging device.

Further, the timing belt may be longer than a length of the multiple set component mounters by at least a length of a single component mounter, such that at least one component mounter can be added without needing to provide a join in the timing belt. Accordingly, even when adding a component mounter to the component mounter line, there is no need to provide a join in the timing belt and work is easy.

Also, the position detecting device may be provided with a support mechanism configured to variably change a position of the timing pulley in a direction perpendicular to that of the timing belt within a range in which the teeth of the timing pulley and the teeth of the timing belt remain engaged, and a biasing means configured to bias the timing pulley in a direction pushed towards the timing belt. Accordingly, even if a small level difference arises between component mounters due to the deviation in the setting position of each of the multiple component mounters, causing a slight level difference in the timing belt, the timing pulley can be moved in accordance with the level difference to maintain stable engagement with the timing belt, such that stable position detecting accuracy of the automatic exchanging device with respect to the level difference between the component mounters can be maintained.

DESCRIPTION OF EMBODIMENTS

An embodiment of the disclosure is described below. First, the configuration of a component mounting line 10 will be described with reference to FIGS. 1 to 3.

Component-mounted-board production line 10 is configured from multiple component mounters 12 lined up in a row along a conveyance direction (X direction) of circuit board 11, with a solder printer (not shown) for printing solder on circuit board 11, feeder storage device 19 (production device) for storing cassette-type feeders 14, and the like being provided on the board loading side of component mounting line 10.

Figure 2:
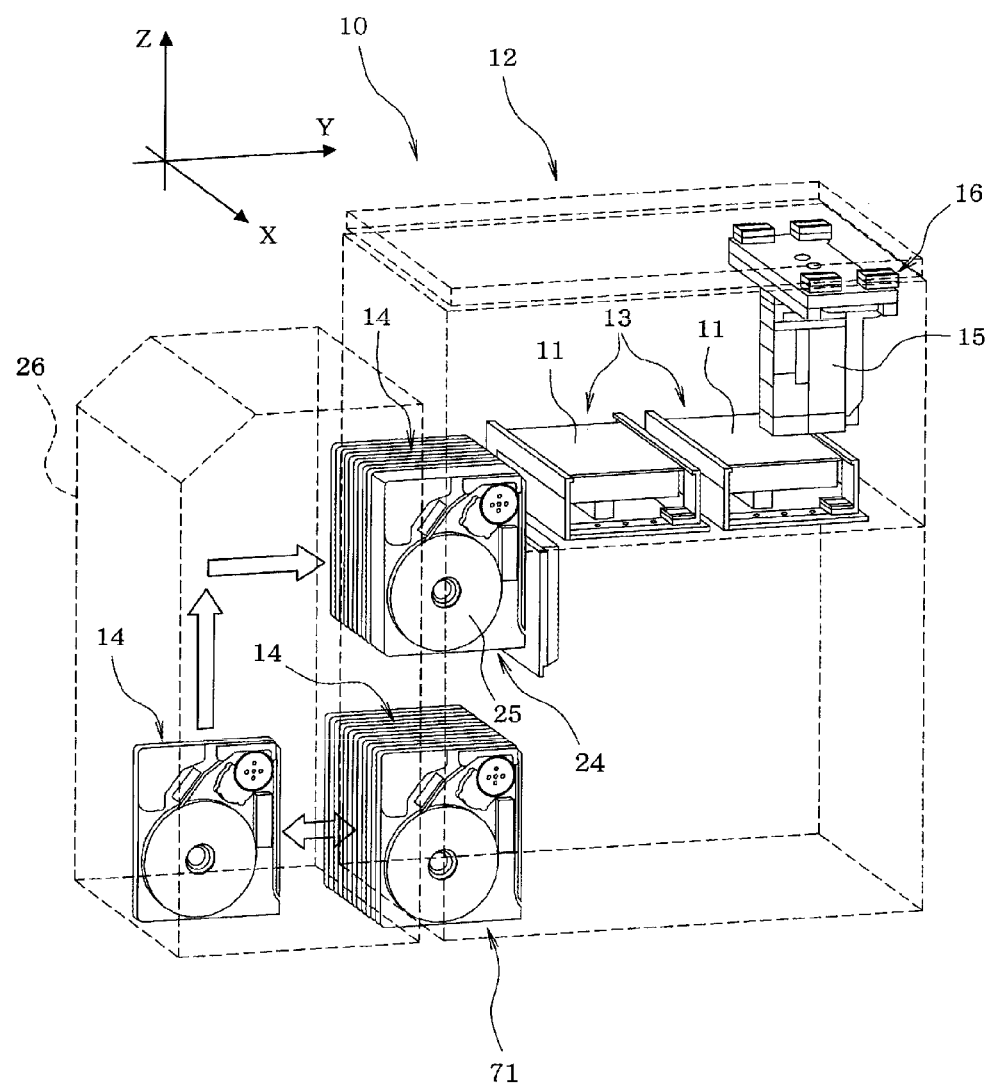
FIG. 2 is a perspective view schematically showing the configuration of the automatic exchanging device and a component mounter.

As shown in FIG. 2, each component mounter 12 is provided with two conveyors 13 that convey circuit board 11, mounting head 15 that holds a suction nozzle (not shown) that picks up a component supplied from cassette-type feeder 14 and mounts the component on circuit board 11, head moving device 16 that moves head 15 in the XY directions (left-right and front-rear directions), and component imaging camera 17 (refer to FIG. 3) that images from below the component held by the suction nozzle. Mark imaging camera 18 (refer to FIG. 3) for imaging reference marks (not shown) of circuit board 11 is attached to head moving device 16 so as to move in the XY directions together with mounting head 15.

Figure 3:
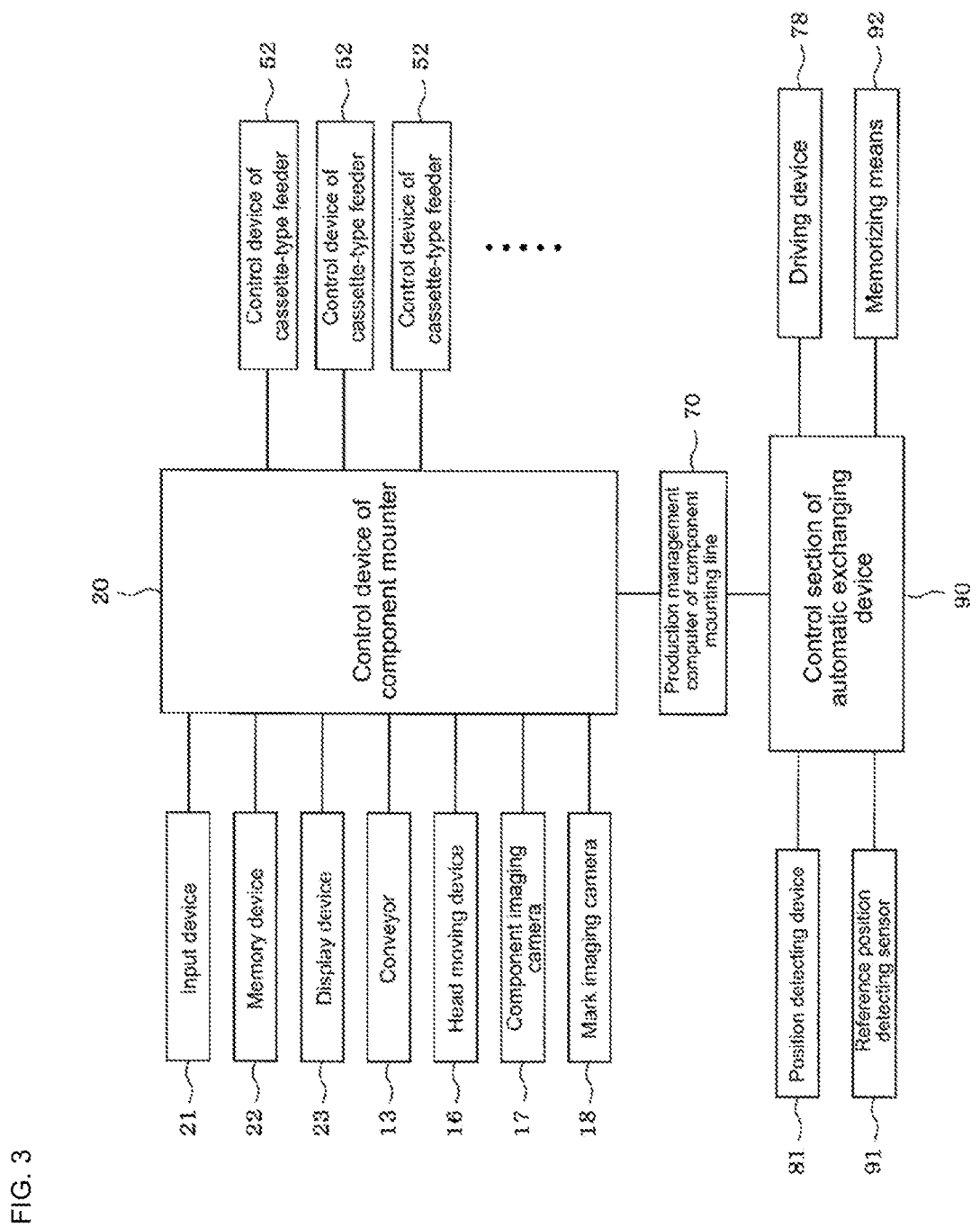
FIG. 3 is a block diagram schematically showing the configuration of control items of the component mounting line equipped with the automatic exchanging device.

Also, as shown in FIG. 3, connected to control device 20 of component mounter 12 are, for example, input device 21 such as a keyboard, mouse, or touchscreen panel; memory device 22 (memorizing means) including a hard disk, RAM, ROM and so on for memorizing various types of programs, data, and the like used for control; and display device 23 such as a liquid crystal display or CRT. Control device 20 of each component mounter 12 is connected via a network to production management computer 70 that manages overall production of component mounting line 10, and production of component mounting line 10 is managed by production management computer 70.

In each of the component mounters 12 of component mounting line 10, circuit board 11 conveyed from an upstream component mounter 12 is conveyed to a specified position by conveyor 13, the circuit board 11 is clamped in position by a clamp mechanism (not illustrated), a reference mark of the circuit board 11 is imaged by mark imaging camera 18 to recognize the position (reference position of the circuit board 11) of the reference mark; and a component supplied from cassette-type feeder 14 is picked by the suction nozzle of mounting head 15, moved from the pickup position to an imaging position, and imaged from below by component imaging camera 17 to determine a pickup position deviation amount and the like; thereafter, the pickup position deviation amount is corrected and the component is mounted on the circuit board 11 on conveyor 13 to produce a component-mounted-board.

Figure 4:
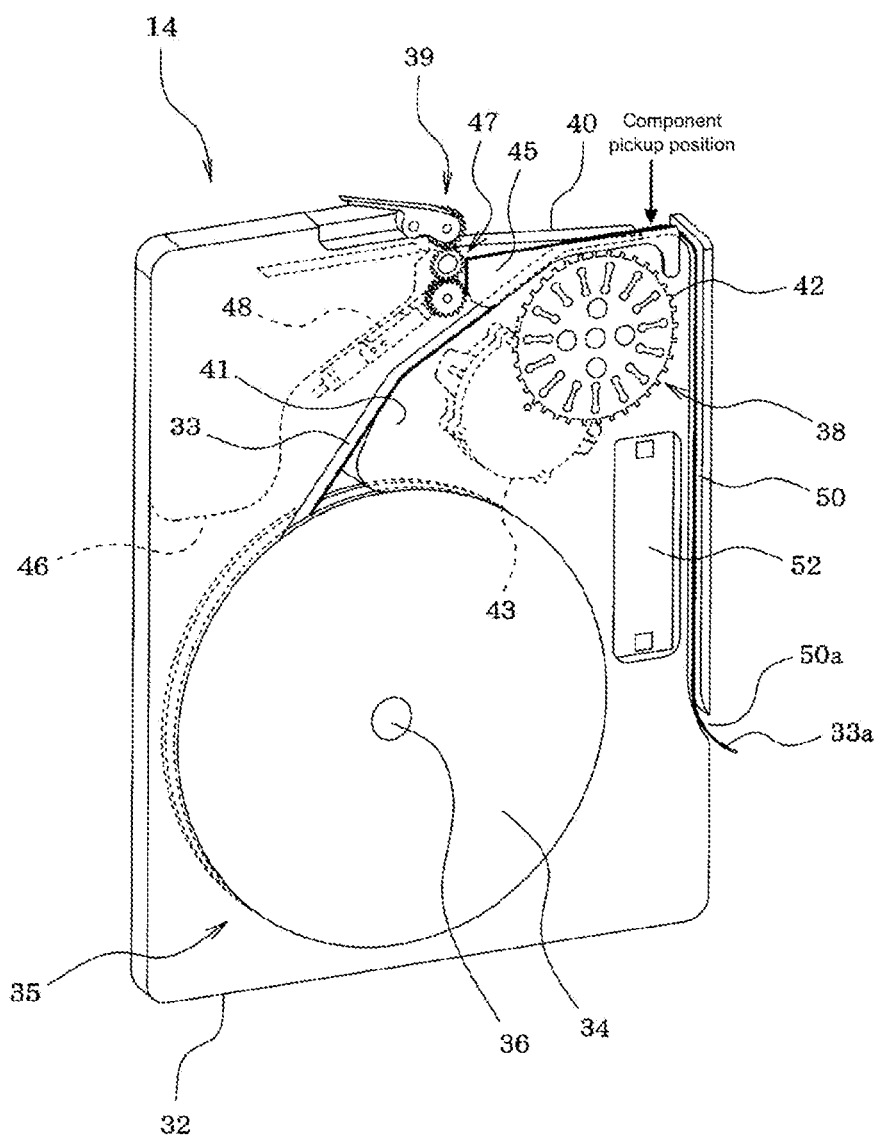
FIG. 4 is a perspective view showing a cassette-type feeder.

Next, the configuration of cassette-type feeder 14 is described with reference to FIG. 4.

Cassette-case 32 of cassette-type feeder 14 is formed from transparent or non-transparent plastic or metal plates or the like, and a side section (cover) thereof can be opened and closed. Tape loading section 35, in which tape reel 34 around which component supply tape 33 is wound is loaded in a detachable (exchangeable) manner, is provided inside the cassette case 32. Reel holding shaft 36 that holds tape reel 34 in a rotatable manner is provided in the center of tape loading section 35.

Tape feeding mechanism 38 that feeds component supply tape 33 pulled out from tape reel 34 to a component pickup position, and top film peeling mechanism 39 that peels top film 40 (also known as cover tape) from component supply tape 33 before the component pickup position to expose components in component supply tape 33 are provided inside cassette case 32.

Tape feeding mechanism 38 is formed from sprocket 42 that is provided in the vicinity below the component pickup position, motor 43 that drives sprocket 42 to rotate, and the like, and tape feeding mechanism 38 pitch feeds component supply tape 33 to the component pickup position by engaging the teeth of sprocket 42 with tape feeding holes, which are formed in the edge of one side of component supply tape 33 at a predetermined pitch, and rotating sprocket 42.

Top film peeling mechanism 39 is formed from tape retainer 45 for retaining component supply tape 33 before the component pickup position and peeling top film 40 from the top surface of component supply tape 73, top film feeding gear mechanism 47 that pulls top film 40 that is peeled by tape retainer 45 in the opposite direction from the tape feeding direction to feed top film 40 into top film collection section 46, which is provided on the top portion of cassette case 32, motor 48 that drives top film feeding gear mechanism 47, and the like.

Waste tape disposal path 50 that guides waste tape 33a (in the first embodiment, only the carrier tape from which top film 40 has been peeled), which has passed the component pickup position and from which the components have been removed, downward to dispose of waste tape 33a is provided extending downwards at the end section of the tape feeding direction side within cassette case 32, and outlet 50a of waste tape disposal path 50 is provided in a position closer to the bottom side than the center of the end surface of the tape feeding direction side of cassette case 32.

Control device 52 that controls motor 43 of tape feeding mechanism 38 and motor 48 of top film peeling mechanism 39 is provided within cassette case 32. In addition, while not shown in the drawings, a connector for communication and power that is connected to the connector for communication and power of component mounter 12 is provided in cassette case 32.

Figure 1:
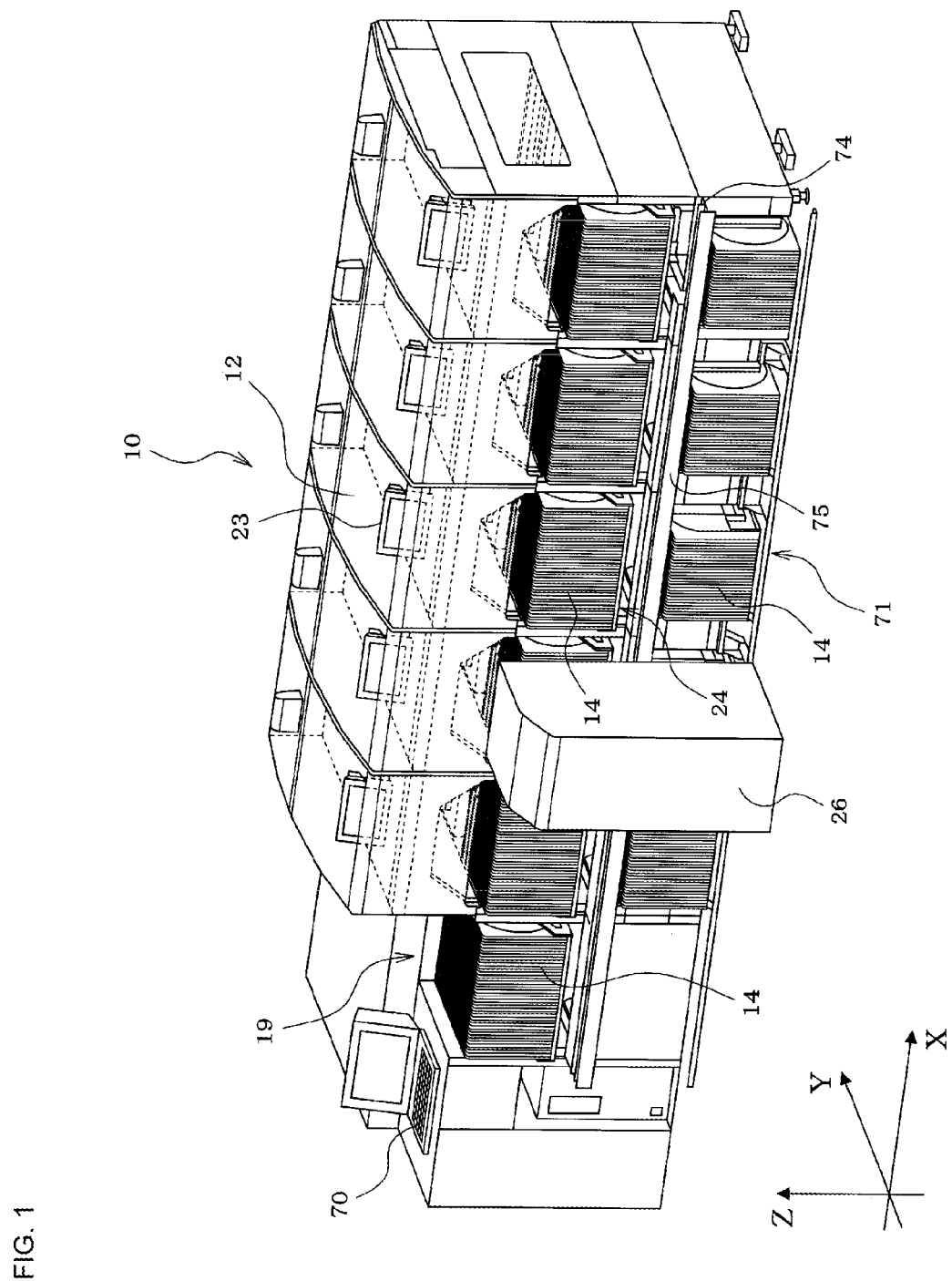
FIG. 1 is a perspective view of the overall configuration of a component mounting line, which is an embodiment of the present disclosure.

As shown in FIG. 1, automatic exchanging device 26 that performs setting and removing of cassette-type feeders 14 to and from feeder setting section 24 of each component 12 is provided on the front side of component mounting line 10. Stock section 71 for stocking multiple feeders 14 to be set on feeder setting section 24 is provided below feeder setting section 24 of each component mounter 12. Automatic exchanging device 26 removes feeders 14 that are exchange targets from feeder setting section 24 of the multiple component mounters 12 and collects them in stock section 71, and removes feeders 14 specified in the production job (production program) from stock section 71 and sets the feeders 14 in the feeder setting section 24 of the multiple component mounters 12.

Guide rail 74 for moving automatic exchanging device 26 in the left-right direction (X direction) along the row of component mounters 12 is provided on the front side of component mounting line 10 so as to extend in the X direction along the entire length of component mounting line 10. The board loading side of guide rail 74 extends to feeder storage device 19, and automatic exchanging device 26 moves in front of feeder storage device 19, removes feeders 14 specified in the production job from feeder storage device 19, and returns used feeders 14 to feeder storage device 19.

Figure 5:
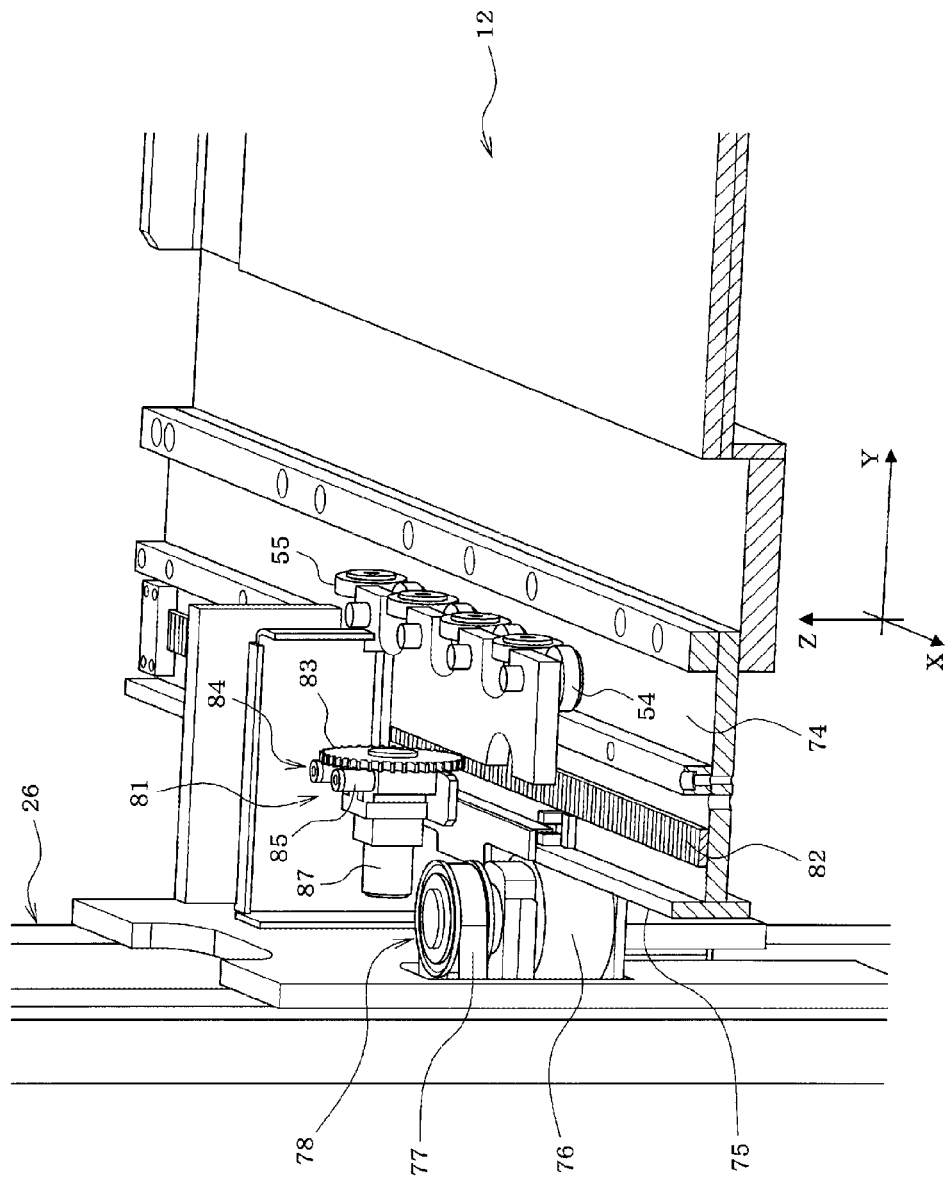
FIG. 5 is a perspective view showing the configuration of the driving device that drives the automatic exchanging device and surrounding portions.

As shown in FIG. 5, provided on the rear side of automatic exchanging device 26 in a freely rotating manner and alternating one after another are multiple Y-direction regulating guide rollers 54 that regulate the movement of automatic exchanging device 26 in the Y direction (a direction perpendicular to the X direction), and multiple Z-direction regulating guide rollers 55 that regulate the movement of automatic exchanging device 26 in the Z direction (up-down direction); Y-direction regulating rollers 54 roll along the side wall of guide rail 74 and Z-direction regulating rollers 55 roll along the horizontal surface of guide rail 74, thereby guiding automatic exchanging device 26 to be moved in the X direction only.

A space on the front side of component mounting line 10 is a moving lane along which automatic exchanging device 26 moves in the X direction, and moving rail 75 is provided on guide rail 74 on the front side of component mounting line 10 extending in the X direction. With respect to this, driving device 78 for drive-rotating driving wheel 76, which is formed of an elastic material such as rubber, via belt transmission mechanism 77 is provided on automatic exchanging device 26, and by driving wheel 76 rolling along moving rail 75, automatic exchanging device 26 is driven in the X direction.

Figure 6:
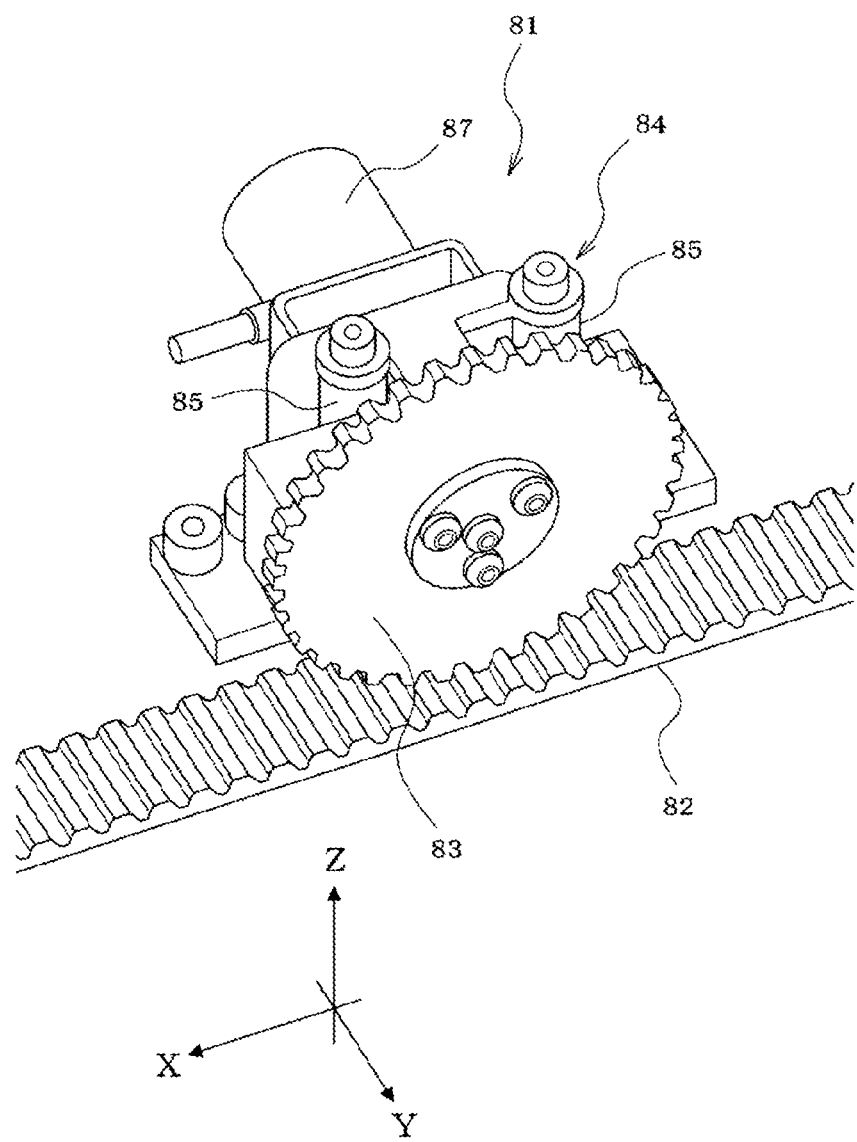
FIG. 6 is a perspective view showing the configuration of the position detecting device that detects the position of the automatic exchanging device.

Next, the configuration of position detecting device 81 that detects the position of automatic exchanging device 26 is described with reference to FIGS. 5 and 6.

Timing belt 82 with an end and formed from an elastic material such as rubber is provided to extend in a straight line in the X direction along guide rail 74. It is desirable for the length of timing belt 82 to be longer than the length of the multiple set component mounters 12 by at least the length of one of the set component mounters 12. In this case, it is not necessary to cut the excess portion of timing belt 82 to match that of the quantity of set component mounters 12, and the excess portion of timing belt 82 can be attached to the rear surface of the guide rail, tied up, or the like, such that the excess portion of timing belt 82 is not in the way.

With respect to this, timing pulley 83 that moves together with automatic exchanging device 26 while maintaining an engaged state with the teeth of timing belt 82 is provided on automatic exchanging device 26. Support mechanism 84 that supports timing pulley 83 is configured to support timing pulley 83 to be movable in a direction perpendicular to timing belt 82 (which is the vertical direction in the present embodiment) within a range in which the teeth of timing pulley 83 and the teeth of timing belt 82 remained engaged, and also provided is biasing means 85 (for example, a spring, or an elastic member made of gum or the like) that biases the timing pulley in a direction being pushed towards timing belt 82.

Further, rotary encoder 87, which is a magnetic type or optical type, is provided on automatic exchanging device 26 as a rotation angle sensor that detects the rotation angle of timing pulley 83. This rotary encoder 87 is capable of detecting forward and reverse rotation and outputs a pulse for each of a specified angle rotation of timing pulley 83, then the pulse output of rotary encoder 87 is entered into control device 90 (refer to FIG. 3) of automatic exchanging device 26.

Control device 90 of automatic exchanging device 26 functions as the detecting circuit section that detects the position of automatic exchanging device 26 based on the pulse output of rotary encoder 87 (hereinafter referred to as "encoder pulse"), and during operation of automatic exchanging device 26 (during rotation of timing pulley 83), counts the encoder pulses, and by switching the up or down count operation in accordance with the rotation direction of timing pulley 83 (movement direction of automatic exchanging device 26), maintains the corresponding relationship between the count value of the encoder pulses and the position of automatic exchanging device 26 and detects the position of automatic exchanging device 26 based on the count value of the encoder pulses. Here, the count operation of the encoder pulses may be performed by an up-down counter configured from an electrical circuit (hardware) or an up-down counter configured from software installed on control device 90.

With the present embodiment, because support mechanism 84 that supports timing pulley 83 is configured to support timing pulley 83 to be movable in a direction perpendicular to timing belt 82 (Z direction) within a range in which in which the teeth of timing pulley 83 and the teeth of timing belt 82 remain engaged, and biasing means 85 that biases the timing pulley in a direction being pushed towards timing belt 82 is provided, even if a small level difference arises between component mounters 12 due to the deviation in the setting position of each of the multiple component mounters 12, causing a slight level difference in timing belt 82, timing pulley 83 can be moved in accordance with the level difference to maintain stable engagement with timing belt 82, such that stable position detecting accuracy of automatic exchanging device 26 with respect to the level difference between component mounters 12 can be maintained.

However, in a case of detecting the position of automatic exchanging device 26 using position detecting device 81, it is necessary to set at least one reference position, thus, the movement distance of automatic exchanging device 26 from the reference position is measured from the rotation amount (rotation angle) of timing pulley 83 detected based on the count value of the encoder pulses, and the movement of automatic exchanging device 26 is controlled by detecting the position of automatic exchanging device 26 with respect to the reference position based on the measured value. In this case, if each of the multiple component mounters 12 that configure component mounting line 1 are set up accurately without any positional deviation, with just one reference position, no deviation arises in the corresponding relationship between the movement distance (position) of automatic exchanging device 26 from the reference position and the position of each of the multiple component mounters 12, but in reality, because them is a possibility that each of the multiple component mounters 12 is set up with a slight positional deviation, there is a possibility that a deviation arises in the corresponding relationship between the movement distance (position) of automatic exchanging device 26 from the reference position and the position of each of the multiple component mounters 12. If there is a deviation in this corresponding relationship, the position of automatic exchanging device 26 with respect to each of the multiple component mounters 12 cannot be controlled accurately, meaning that problems may occur with setting or removing feeders 14 to and from each component mounter 12.

To counter this, with the present embodiment, a reference position is provided on at least two of (in the present embodiment, all of) the component mounters 12 out of the multiple component mounters 12, reference position detecting sensor 91 (reference position detecting means) configured to output a reference position detection signal when the position of automatic exchanging device 26 matches the reference position of the component mounter 12 is also provided, and control device 90 of automatic exchanging device 26 is configured to correct a detected position (count value of encoder pulses) of position detecting device 81 when the reference position detection signal is output from reference position detecting sensor 91 so as to correspond to the reference position of the component mounter 12. Accordingly, because it is possible to detect the movement distance (position) of automatic exchanging device 26 with respect to the reference position of at least two component mounters 12 of the multiple component mounters 12, the deviation in the corresponding relationship between the movement distance (position) of automatic exchanging device 26 from the reference position and the position of each of the multiple component mounters 12 can be reduced or eliminated, meaning that it is possible to control the position of automatic exchanging device 26 with respect to each of the multiple component mounters 12 accurately, preventing problems when setting or removing feeders to and from the component mounters 12.

In this case, during setup of component mounter 12 or during calibration prior to starting production, driving device 78 is used to move automatic exchanging device 26, and a corresponding relationship between the reference position of the component mounter 12 and the detection position (count value of encoder pulses) of automatic exchanging device 26 when the position of automatic exchanging device 26 matches the reference position of component mounter 12 is memorized on non-volatile memorizing means 92 (for example, a hard disk, ROM, EEPROM) of control device 90 of automatic exchanging device 26, and during production control device 90 of automatic exchanging device 26 performs interpolation correction such as straight line interpolation of the detection position (count value of encoder pulses) of position detecting device 81 between the reference positions of the component mounters 12 based on the data memorized in memorizing means 92. Accordingly, the detection accuracy of the position of automatic exchanging device 26 between the reference positions of the component mounters 12 is improved.

Note that, in reference position detection processing (initial processing) when starting production, it is necessary to correct the detection position (count value of encoder pulses) of position detecting device 81 after moving automatic exchanging device 26 to the reference position of the component mounter 12 to correspond to the reference position of the component mounter 12, but if the stopping position of automatic exchanging device 26 before starting production is far away from the reference position of the component mounter 12, it takes time to perform reference position detection processing when starting production, and the start of production is delayed by that amount.

Thus, with the present embodiment, control device 90 of automatic exchanging device 26, by performing reference position detection processing when starting production, uses driving device 78 to move automatic exchanging device 26 to the reference position of the nearest component mounter 12 and corrects the detection position (count value of encoder pulses) of position detecting device 81 to correspond to the reference position of that component mounter 12. Accordingly, by performing reference position detection processing when starting production, it is possible to shorten the distance moved by automatic exchanging device 26 to the reference position of the component mounter 12, thus shortening the time for reference position detection processing when starting production.

Here, reference position detecting sensor 91 may be, for example, a non-contact sensor such as a light sensor or a proximity sensor, or a contact switch such as a limit switch. Further, reference position detecting sensor 91 may be provided on automatic exchanging device 26, or on component mounter 12.

For example, if reference position detecting sensor 91 is provided on automatic exchanging device 26, a reference section (not shown) configured to be detected by reference position detecting sensor 91 of automatic exchanging device 26 when the position of automatic exchanging device 26 matches the reference position of the component mounter 12 may be provided on at least two of (in the present embodiment, all of) the component mounters 12 out of the multiple component mounters 12.

On the other hand, if reference position detecting sensor 91 is provided on at least two of the component mounters 12 out of the multiple component mounters 12, the reference section (not shown) configured to be detected by reference position detecting sensor 91 of the component mounter 12 when the position of automatic exchanging device 26 matches the reference position of the component mounter 12 may be provided on automatic exchanging device 26.

As shown in FIG. 3, control device 90 of automatic exchanging device 26 is connected to production management computer 70 of component mounting line 10 via a network, and in accordance with information of a production job sent from production management computer 70 of component mounting line 10, uses driving device 78 to move automatic exchanging device 26 to a position of a component mounter 12 specified in the production job and controls operation of setting and removing feeders 14 to and from feeder setting section 24 of the component mounter 12 while detecting the position of automatic exchanging device 26 with position detecting device 81.

With the embodiment described above, by using a configuration that moves automatic exchanging device 26 with driving wheel 76, while achieving smooth movement, low noise levels, improved durability, and the like, by detecting a rotation angle of timing pulley 83 that engages with timing belt 82 provided straddling multiple component mounters 12 using rotary encoder 87, it is possible to cancel an error between the angle of driving wheel 76 and the movement distance of automatic exchanging device 26 that arises due to slipping of driving wheel 76, so the position of automatic exchanging device 26 can be detected with good accuracy. Further, because cheap mass-produced commercially available items can be used for timing belt 2, timing pulley 83, and rotation encoder 87 that configure position detecting device 81, position detecting device 81 can be cheap and compact, durability can be guaranteed, and when setting up the component mounters 12, it is sufficient to attach a single timing belt 82 so as to straddle multiple component mounters 12, thus reducing the workload on an operator. Additionally, so long as the length of timing belt 82 is at least as long as the length of the multiple set component mounters 12, it is not necessary to cut the excess portion of timing belt 82 to match the quantity of the component mounters 12, because the excess portion of timing belt 82 can be attached in a position out of the way, tied up, or the like, meaning that it is easy to perform work such as increasing or decreasing the quantity of set component mounters 12 (changing the line length).

Note that, in the above embodiment, rotary encoder 87 is used as the rotation angle sensor that detects the rotation angle of timing pulley 83, but another type of rotation angle sensor may be used, such as a resolver.

Otherwise, the present disclosure is not limited to the above embodiments, and it goes without saying that various changes and modifications can be made without departing from the gist of the disclosure, such as the configuration of component mounting machine 12, the configuration of automatic exchanging system 26, or the configuration of feeder 14 may be changed as appropriate.

REFERENCE SIGNS LIST

10: component mounting line;
11: circuit board;
12: component mounter;
13: conveyor;
14: cassette-type feeder;
15: mounting head;
16: head moving device;
20: control device of component mounter;
26: automatic exchanging device;
54: Y-direction regulating guide roller;
55: Z-direction regulating guide roller;
70: production management computer,
71: stock section;
74: guide rail;
75: moving rail;
76: driving wheel;
77: belt transmission mechanism;
78: driving device;
81: position detecting device;
82: timing belt;
83: timing pulley;
84: support mechanism;
85: biasing means:
87: rotary encoder (rotation angle sensor);
90: control device (detecting circuit section) of automatic exchanging device;
91: reference position detecting sensor (reference position detecting means);
92: memorizing means

The invention claimed is:

1. A component mounting line, comprising:
multiple component mounters arranged in a row along a conveyance direction of a circuit board, the component mounters being configured to mount components supplied from feeders set on a feeder setting section of each of the component mounters on the circuit board;
an automatic exchanging device configured to move along a moving lane provided along the row of the multiple component mounters, and to set and remove the feeders to and from the feeder setting section of each of the component mounters;
a driving device configured to drive the automatic exchanging device along the moving lane using a driving wheel;
a position detecting device configured to detect the position of the automatic exchanging device, the position detecting device including
a timing belt with an end provided to extend in a straight line along the moving lane straddling the multiple component mounters,
a timing pulley configured to move together with the automatic exchanging device while maintaining a state of being engaged with teeth of the timing belt,
a rotation angle sensor configured to detect a rotation angle of the timing pulley, and
a detecting circuit section configured to detect a position of the automatic exchanging device based on an output signal of the rotation angle sensor;
a reference position detecting sensor configured to output a reference position detection signal when the position of the automatic exchanging device matches a reference position of the component mounter; and
a control device configured to move the automatic exchanging device to a specified position using the driving device based on a detection result of the position detecting device, wherein
the position detecting device is configured to correct a detected position of the detecting circuit section when the reference position detection signal is output from the reference position detecting sensor so as to correspond to the reference position of the component mounter.

2. The component mounting line according to claim 1, wherein the rotation angle sensor is a rotary encoder configured to detect a forward and reverse rotation and output a pulse for each of a specified angle rotation of the timing pulley, and the detecting circuit section counts the pulses output by the rotary encoder and, by switching the up or down count operation in accordance with the rotation direction of the timing pulley, maintains a corresponding relationship between a count value of the pulses and a position of the automatic exchanging device and detects the position of the automatic exchanging device based on the count value of the pulses.

3. The component mounting line according to claim 1, wherein the reference position is provided on at least two of the component mounters out of the multiple component mounters, the position detecting device is configured to correct a detected position of the detecting circuit section when the reference position detection signal is output from the reference position detecting sensor so as to correspond to the reference position of the component mounter.

4. The component mounting line according to claim 3, wherein the reference position detecting sensor is provided on at least two of the multiple component mounters, and a reference section, configured to be detected by the reference position detecting sensor when the position of the automatic exchanging device matches the reference position, is provided on the automatic exchanging device.

5. The component mounting line according to claim 1, wherein the position detecting device, during setup of the component mounter or during calibration prior to starting production, uses the driving device to move the automatic exchanging device, memorizes in a memory a corresponding relationship between the reference position of the component mounter and the detection position of the detecting circuit section when the position of the automatic exchanging device matches the reference position of the component mounter, and during production performs interpolation correction of the detection position of the detecting circuit section between the reference positions of the component mounters based on the data memorized in the memory.

6. The component mounting line according to claim 5, wherein the position detecting device, by performing reference position detecting processing when starting production, uses the driving device to move the automatic exchanging device to the reference position of the nearest component mounter so as to correct the detection position of the detecting circuit section to correspond to the reference position of the component mounter.

7. The component mounting line according to claim 1, wherein the reference position detecting sensor is provided on the automatic exchanging device, and a reference section, configured to be detected by the reference position detecting sensor when the position of the automatic exchanging device matches the reference position, is provided on at least two of the multiple component mounters.

8. The component mounting line according to claim 1, wherein the timing belt is longer than a length of the multiple component mounters by at least a length of a single component mounter, such that at least one component mounter can be added without needing to provide a join in the timing belt.

9. The component mounting line according to claim 1, wherein the position detecting device includes a support mechanism configured to variably change a position of the timing pulley in a direction perpendicular to that of the timing belt within a range in which the teeth of the timing pulley and the teeth of the timing belt remain engaged, and a biasing device configured to bias the timing pulley in a direction pushed towards the timing belt.

* * * * *